US005537067A

United States Patent [19]
Carvajal et al.

[11] Patent Number: 5,537,067
[45] Date of Patent: Jul. 16, 1996

[54] SIGNAL DRIVER CIRCUIT OPERABLE TO CONTROL SIGNAL RISE AND FALL TIMES

[75] Inventors: Fernando D. Carvajal, McKinney; David D. Briggs, Dallas, both of Tex.

[73] Assignee: Texas Instruments Incorporated, Dallas, Tex.

[21] Appl. No.: 209,858

[22] Filed: Mar. 11, 1994

[51] Int. Cl.$^6$ ................................................. H03K 1/00
[52] U.S. Cl. ........................... 327/108; 327/111; 327/112
[58] Field of Search ................................... 327/107, 108, 327/109, 110, 111, 112, 113, 190, 191, 196, 200, 211

[56] References Cited

U.S. PATENT DOCUMENTS

| | | | |
|---|---|---|---|
| 4,295,062 | 10/1981 | Mihalich et al. | 307/279 |
| 4,716,313 | 12/1987 | Hori et al. | 307/475 |
| 4,785,262 | 11/1988 | Ryu et al. | 331/111 |
| 4,924,120 | 5/1990 | Schenck | 307/542 |
| 4,947,063 | 8/1990 | O'Shaughnessy et al. | 307/572 |
| 5,057,722 | 10/1991 | Kobatake | 307/605 |
| 5,068,553 | 11/1991 | Love | 307/605 |
| 5,120,992 | 6/1992 | Miller et al. | 307/270 |

*Primary Examiner*—John S. Heyman
*Assistant Examiner*—Kenneth B. Wells
*Attorney, Agent, or Firm*—Paul C. Hashim; Wade James Brady, III; Richard L. Donaldson

[57] ABSTRACT

A signal driver circuit (10) is provided that comprises a first inverter comprising a P-FET (14), an N-FET (16) and a resistor (18). A second inverter comprises a P-FET (20) and an N-FET (22). Resistor (18) and capacitors (24) and (26) limit the transition times of the output driving signal to control electromagnetic radiation caused by rapid transition times in the output signal. Circuit (10) is independent of the amount of capacitive load (28) driven by the circuit.

11 Claims, 1 Drawing Sheet

5,537,067

SIGNAL DRIVER CIRCUIT OPERABLE TO CONTROL SIGNAL RISE AND FALL TIMES

TECHNICAL FIELD OF THE INVENTION

This invention relates in general to the field of electronic systems and more particularly to an improved signal driver circuit.

BACKGROUND OF THE INVENTION

In the design of integrated circuit systems, square wave signals are propagated throughout the systems to communicate information and trigger events in a variety of contexts. In the case of clock signals, the same signal may be used throughout a large integrated system. As such, large driver circuits are used to create and to drive the signals throughout the integrated system. Large current changes and voltage changes associated with these signals can create electromagnetic radiation. In certain applications, this electromagnetic radiation can cause electromagnetic interference with other systems. For example, microcontroller systems for automotive applications can cause interference on the radio of the automobile if they emit too much electromagnetic radiation.

The electromagnetic radiation is largely due to the rapid rise and fall times of square wave signals propagated throughout an integrated circuit system. The rapid voltage transitions of a square wave signal when passed into the capacitive network of the integrated circuit can cause high levels of transient current causing interference in associated systems.

SUMMARY OF THE INVENTION

Accordingly, need has arisen for a signal driver circuit which substantially reduces or eliminates disadvantages associated with prior systems and methods of providing signals to integrated circuit systems.

In accordance with the teachings of the present invention, a signal driver circuit is provided that eliminates problems with prior systems by controlling the rise and fall times of clock signals or other signals used often in an integrated circuit system.

According to one embodiment of the present invention, a signal driver circuit is provided that receives a square wave signal from a clock generator. The signal driver circuit comprises a first inverter which comprises a first p-channel transistor and a first n-channel transistor and a resistor. The second inverter output is coupled back to the input circuit through a pair of capacitors. The second inverter circuit comprises a second p-channel transistor and a second n-channel transistor. The output of the second inverter is coupled to a capacitive load made up of load parasitic capacitances and gate capacitances. The operation of the resistor and two capacitors in the second inverter function to limit the rise and fall times of the output signal such that electromagnetic radiation is greatly reduced.

BRIEF DESCRIPTION OF THE DRAWINGS

A more complete understanding of the teachings of the present invention may be acquired by referring to the attached FIGURE wherein.

DETAILED DESCRIPTION OF THE INVENTION

Figure 1:
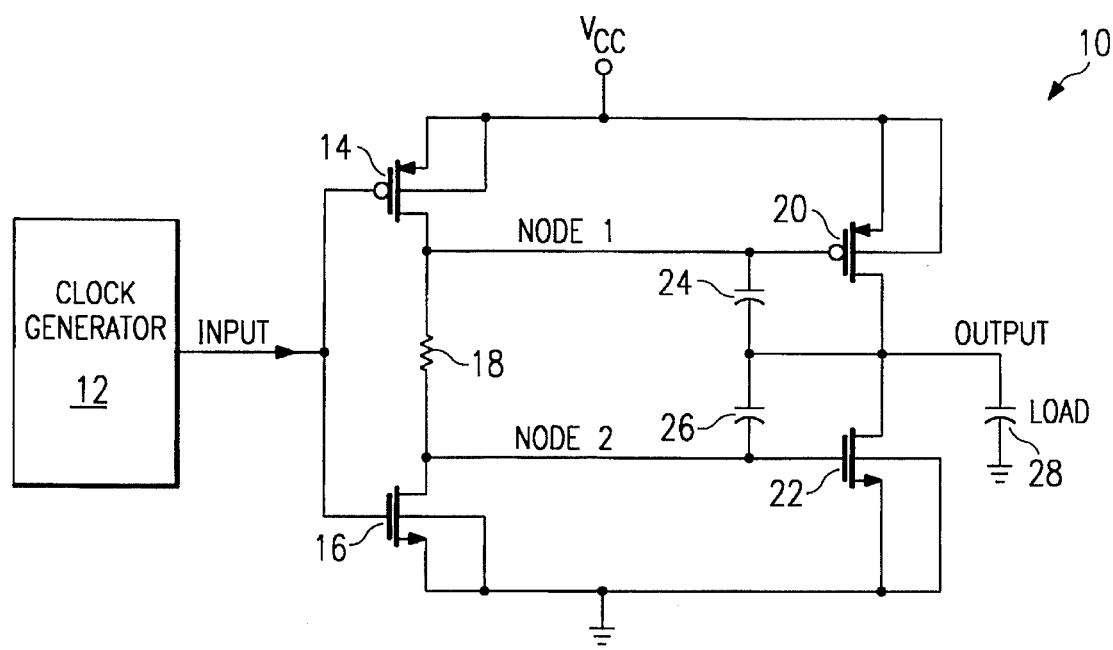
FIG. 1 is a schematic illustration of a signal driver circuit constructed according to the teachings of the present invention.

Referring to FIG. 1, a signal driver circuit indicated generally at 10 is shown coupled to the output of a clock generator circuit 12 that may comprise, for example, a phase lock loop circuit. Clock generator circuit 12 provides an input signal which comprises a square wave signal having a frequency on the order of 1 to 10 MHz. The input signal is provided to the gates of a p-channel field effect transistor (P-FET) 14 and an n-channel field effect transistor (N-FET) 16. P-FET 14 has its source and backgate coupled to a $V_{cc}$ supply voltage. The drain of P-FET 14 is coupled to a NODE 1. N-FET 16 has its source and backgate coupled to ground potential. The drain of N-FET 16 is coupled to a NODE 2. A resistor 18 is coupled between NODE 1 and NODE 2. NODE 1 is coupled to the gate of a second P-FET 20. P-FET 20 has its source and backgate coupled to the $V_{cc}$ supply voltage. The drain of P-FET 20 is coupled to an OUTPUT NODE.

NODE 2 is coupled to the gate of a second N-FET 22. N-FET 22 has its source and backgate coupled to ground potential. The drain of N-FET 22 is coupled to the OUTPUT NODE.

NODE 1 is coupled to the OUTPUT NODE through a capacitor 24. NODE 2 is coupled to the OUTPUT NODE through a capacitor 26.

Resistor 18 may comprise, for example, a polycrystalline resistor having resistance on the order of 2.4 kiloohms. Capacitor 24 comprises a capacitor having a capacitance on the order of 0.39 picofarads. Capacitor 26 may comprise a capacitor having a capacitance on the order of 0.69 picofarads. P-FET 14 has a size and current carrying capacity relative to the remaining transistors in system 10 of 50 units. N-FET 16 has a relative size of 33 units. P-FET 20 has a relative size of 1,000 units and N-FET 22 has a relative size of 700 units.

The OUTPUT NODE is coupled to ground potential through a load capacitor 28. Load capacitor 28 may comprise on the order of 10 picofarads of capacitance and is intended to represent the capacitive load associated with parasitic lead capacitances and gate capacitances of the integrated circuit coupled to signal driver circuit 10.

In operation, the combination of P-FET 14 and N-FET 16 create a first inverter. Similarly, the combination of P-FET 20 and N-FET 22 create a second inverter. The input clock signal is received in parallel at the gates of P-FET 14 and N-FET 16 and is inverted twice before being transmitted at the OUTPUT NODE. The transmitted output signal has buffered rise and fall times to prevent electromagnetic radiation. The rise and fall times are controlled by the currents passing through resistor 18 and capacitors 24 and 26.

As the input signal encounters a falling edge, P-FET 14 and N-FET 22 turn on. This sets up a current passing through P-FET 14, through resistor 18, through capacitor 26 to the OUTPUT NODE where it is dissipated through load capacitor 28 and N-FET 22. The resistance of resistor 18 and the capacitance of capacitor 26 limit the speed at which the falling edge can occur, thereby reducing the electromagnetic radiation resulting from a fast falling edge.

Similarly, when the input signal encounters a rising edge, P-FET 20 and N-FET 16 turn on. This pulls NODE 2 low quickly, turning off N-FET 22 and then pulls NODE 1 low and the OUTPUT NODE towards $V_{cc}$. This action prevents through current and therefore reduces noise. A current is set up flowing through capacitor 24 from the OUTPUT NODE, through resistor 18 and through N-FET 16 to ground. Once again, the time of the transition for the rising edge is limited by the current carrying capacity of resistor 18 and capacitor 24. The rising edge is therefore buffered to eliminate electromagnetic radiation caused by rapid signal transitions. It should be understood that the values of resistor 18, capacitors 24, and transistors 14, 16, 20, and 22 disclosed herein are included solely for the purposes of teaching advantages of the present invention and should not be construed to limit the scope of the present invention to this or any particular circuit embodiment. The teachings of the present invention are equally applicable to a variety of circuit implementations without departing from the spirit and scope of the present invention.

An important technical advantage of the present invention is due to the fact that the rising and falling edges of the signal output by system 10 are buffered without affecting the frequency or driving capability of the signal. The buffering of the output signal is also largely independent of the amount of load on the circuit. The buffering is dependent on components within the driver circuit 10 itself and therefore does not rely on the capacitance of load capacitor 28.

Although the present invention has been described in detail, it should be understood that various changes, alterations, substitutions, and modifications may be made to the teachings disclosed herein without departing from the spirit and scope of the present invention which is solely defined by the appended claims.

What is claimed is:

1. A signal driver circuit comprising:
   a first inverter circuit comprising a first and second transistor, an input, an output, and a resistor coupled between said first and second transistors;
   a second inverter having an input and an output and being coupled to the output of the first inverter;
   a first capacitor coupled between the output of the second inverter and a node between the first transistor and the resistor;
   a second capacitor coupled between the output of the second inverter and a node between the second transistor and the resistor; and
   the first and second capacitors and the resistor limiting the rise and fall times of an output signal output from the second inverter.

2. The circuit of claim 1 wherein the second inverter comprises third and fourth transistors coupled together and wherein the output of the second inverter is obtained from a node between the third and fourth transistors.

3. The circuit of claim 2 wherein the third transistor comprises a p-channel field effect transistor having a drain and wherein the fourth transistor comprises an n-channel field effect transistor having a drain coupled to the drain of the third transistor.

4. The circuit of claim 1 wherein the first transistor comprises a p-channel field effect transistor having a drain coupled to the resistor and wherein the second transistor comprises an n-channel field effect transistor having a drain coupled to the resistor wherein the first and second transistors are coupled together through the resistor.

5. The circuit of claim 1, further comprising a clock generator circuit coupled to said input of the first inverter and operable to generate a square wave signal and transmit said square wave signal into the input of the first inverter.

6. The circuit of claim 5 wherein the clock generator circuit comprises a phase lock loop circuit.

7. The circuit of claim 6 wherein the first and second transistors each comprise a gate and wherein the square wave signal output is received at the gates of the first and second transistors in parallel.

8. A signal driver circuit comprising:
   a first transistor having a source, drain, and gate, the source of the first transistor being set at a first predetermined voltage level;
   a second transistor having a source, drain, and gate, the source of the second transistor being set at a second predetermined voltage level;
   a resistor coupled between the drains of the first and second transistors;
   a phase lock loop circuit coupled to the gates of the first and second transistors and operable to generate a square wave input signal;
   a third transistor having a source, drain and gate, the gate of the third transistor being coupled to the drain of the first transistor, the source of the first transistor being set at said first predetermined voltage level;
   a fourth transistor having a source, drain, and gate, the gate of the fourth transistor being coupled to the drain of the second transistor, the source of the fourth transistor being set at said second predetermined voltage level, the drains of the third and fourth transistors being coupled together to form an output node;
   a first capacitor coupled between the output node and the gate of the third transistor;
   a second capacitor coupled between the output node and the gate of the fourth transistor; and
   the first and second capacitors and the resistor limiting the rise and fall times of an output signal output from the second inverter.

9. The circuit of claim 8 wherein the third transistor comprises a p-channel field effect transistor and wherein the fourth transistor comprises an n-channel field effect transistor.

10. The circuit of claim 8 wherein the first transistor comprises a p-channel field effect transistor having a drain coupled to the resistor and wherein the second transistor comprises an n-channel field effect transistor having a drain coupled to the resistor, and the first and second transistors are coupled together through the resistor.

11. The circuit of claim 8 further comprising a capacitive load coupled to the output node.

* * * * *